United States Patent
Wetzel et al.

(10) Patent No.: US 7,236,058 B2
(45) Date of Patent: Jun. 26, 2007

(54) LOW FREQUENCY DOUBLER

(75) Inventors: Matthew A. Wetzel, San Diego, CA (US); Harry S. Harberts, San Marcos, CA (US); Paul L. Rodgers, Solana Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 85 days.

(21) Appl. No.: 11/133,024

(22) Filed: May 19, 2005

(65) Prior Publication Data

US 2006/0261865 A1    Nov. 23, 2006

(51) Int. Cl.
*H03L 7/00* (2006.01)

(52) U.S. Cl. .................. 331/34; 331/74; 327/113; 327/116; 327/119; 327/122

(58) Field of Classification Search ............ 327/116, 327/119, 122, 113; 363/157; 331/74, 34
See application file for complete search history.

(56) References Cited

U.S. PATENT DOCUMENTS 6,369,622 B1    4/2002    Lim et al.

OTHER PUBLICATIONS

Moghimi R: "Curing Comparator instability with Hysteresis", Analog Dialogue Analog Devices USA, vol. 34, No. 7, Nov. 2000, p. 3 pp. XP002386469, ISSN: 0161-3626, p. 2, left-hand column.
International Search Report for corres. PCT/US2006/007885, completed Jun. 21, 2006 by V. Robinson, Authorized Officer of the EPO.

*Primary Examiner*—Arnold Kinkead
(74) *Attorney, Agent, or Firm*—Tarolli, Sundheim, Covell & Tummino LLP

(57) ABSTRACT

A circuit and corresponding method for doubling the frequency of an input signal, even when the input signal is of low frequency or a square wave. The input signal is applied to a phase-shifting circuit that produces a pair of output signals that are theoretically 90° apart in phase, but may lack the desired form if the original input signal is of low frequency. The waveforms of the two output signals are enhanced in latching hysteresis buffers that produce more uniformly squared waves, with zero crossings corrected to be more exactly 90° apart and with desirably steep state transitions. The enhanced-waveform output signals are coupled to an exclusive OR (XOR) gate to produce a double-frequency output.

8 Claims, 2 Drawing Sheets

LOW FREQUENCY DOUBLER

BACKGROUND OF THE INVENTION

This invention relates generally to frequency doubler circuits and, more particularly, to frequency doubler circuits capable of operation at relatively low frequencies and capable of handling square-wave signals. Frequency doubling is a commonly required function in many applications of electronic circuitry. A technique commonly used for frequency doubling is to phase-shift an input signal by 90° (90 degrees) and then to apply the input signal and the phase-shifted signal to an exclusive OR (XOR) gate. The XOR gate generates an output signal at twice the frequency of the original input signal. Unfortunately, it is difficult to achieve a 90° phase shift in an integrated circuit for low frequencies, or for a square-wave input signal.

A conventional frequency doubling circuit has problems in handling either square waves or low-frequency signals, and when constrained to draw a constant current from its power supply. Constant current consumption is, however, a requirement in many integrated circuit applications. A convenient and commonly used circuit for achieving a 90° phase shift in input signals covering a broad band of frequencies is a resistor-capacitor/capacitor-resistor (RC-CR) filter, which is depicted in FIG. 1. In this circuit, an input signal applied to an input terminal 10 follows two parallel paths to two output terminals 12 and 14. One of these parallel paths includes a series capacitor 16 and a shunt resistor 17, which together form a high-pass filter. The other parallel path includes a series resistor 18 and a shunt capacitor 19, which together form a low-pass filter. This circuit is commonly used for generating two output signals with a 90° phase difference, from a sine wave input signal. Unfortunately, for a square-wave input, although the output will be a phase-shifted square wave output at terminal 12 from the high-pass side of the filter, the output at terminal 14 from the low-pass side of the filter is a phase-shifted triangle wave. Moreover, the zero crossings of the phase-shifted square wave and triangle waves will not be exactly 90° out of phase. Because of these discrepancies, when this filter circuit is coupled to an XOR gate, the resultant output is not always the desired double-frequency signal.

Accordingly, there is a need for a frequency doubler circuit that will function well for low-frequency and square-wave inputs. The present invention is directed to this end.

SUMMARY OF THE INVENTION

The present invention resides in a frequency doubler that utilizes a conventional phase-shift circuit and a conventional XOR gate, but also includes additional components that compensate for the inadequacies of the phase-shift circuit and allow the doubler to operate well at low frequencies and with square-wave inputs. Briefly, and in general terms, the frequency doubler of the invention comprises a phase shifting circuit for generating from an input signal a pair of output signals having waveforms that are separated in phase by approximately 90°; a pair of hysteresis buffers, operative to enhance the waveforms of the pair of output signals, such that the waveforms have desirably steep transitions and are separated more precisely by a 90° phase difference; and an exclusive OR (XOR) gate, for logically combining the enhanced pair of output signals to produce a single output signal of double the frequency of the input signal.

In the disclosed embodiment of the invention the phase shifting circuit is a resistance-capacitance/capacitance-resistance (RC/CR) filter. More specifically, each of the hysteresis buffers comprises a differential pair of transistors to which one of the pair of output signals is applied as an input, the transistors having two possible switching states in which one or the other of the transistors is latched in a conductive condition; and first and second feedback circuits cross-coupling the outputs of the transistors to their inputs, wherein a gradual change in input signal level results in rapid latching of the pair of transistors in one of its two switching states. Each of the feedback circuits includes a feedback impedance that is selectable to control a latching voltage, which is selected to provide for buffer latching when the pair of output signals are as nearly as possible separated in phase by 90°.

The invention may also be defined as a method for doubling the frequency of an input signal, comprising the steps of generating from the input signal a pair of output signals that are separated in phase by approximately 90°; enhancing the waveforms of the pair of output signals in a pair of hysteresis buffers, such that the waveforms have desirably steep transitions and are separated more precisely by a 90° phase difference; and logically combining the enhanced pair of output signals in an exclusive OR (XOR) gate, to produce a single output signal of double the frequency of the input signal.

More specifically, the step of enhancing the waveforms comprises applying as an input each of the pair of output signals to a differential pair of transistors, the transistors having two possible switching states in which one or the other of the transistors is latched in a conductive condition; and cross-coupling the outputs of the transistors to their inputs, through first and second feedback circuits, wherein a gradual change in input signal level results in rapid latching of the pair of transistors in one of its two switching states. The method may further include selecting feedback impedance values in the feedback circuits, to control selection of a latching voltage, wherein the latching voltage is selected to provide for buffer latching when the pair of output signals are as nearly as possible separated in phase by 90°.

It will be appreciated from the foregoing that the present invention represents a significant advance in the frequency doubling techniques. In particular, the invention provides a simple and convenient frequency doubler that operates well even at low frequencies and lends itself to convenient implementation in integrated circuit form. Other aspects and advantages of the invention will become apparent from the following more detailed description, taken in conjunction with the accompanying drawings.

DETAILED DESCRIPTION OF THE INVENTION

Figure 1:
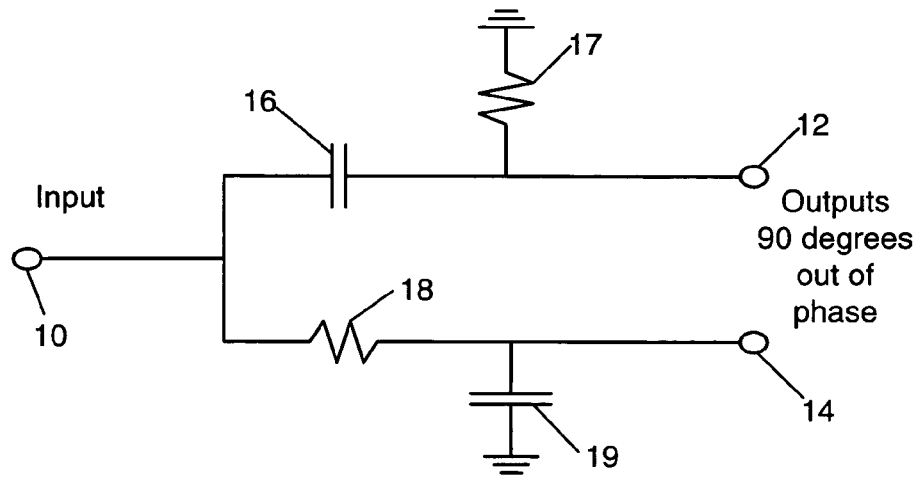
FIG. 1 is a schematic diagram of a resistor-capacitor/capacitor-resistor (RC-CR) filter of the prior art, used to generate sine wave outputs having a 90° phase difference.

As shown in the drawings for purposes of illustration, the present invention is concerned with frequency doubling circuits. A common approach to doubling the frequency of sine wave signals is to combine a 90° phase-shifting circuit like the one shown in FIG. 1 with an exclusive OR (XOR) gate, which produces a double-frequency output from two input signals that are 90° apart in phase. As discussed above, this arrangement does not function well when the input signal is of very low frequency or is a square wave. In particular, if a square-wave input signal is applied to the FIG. 1 phase-shifting circuit, the two output signals are square and triangular waves, respectively, with zero crossings that are not always 90° apart.

Figure 2:
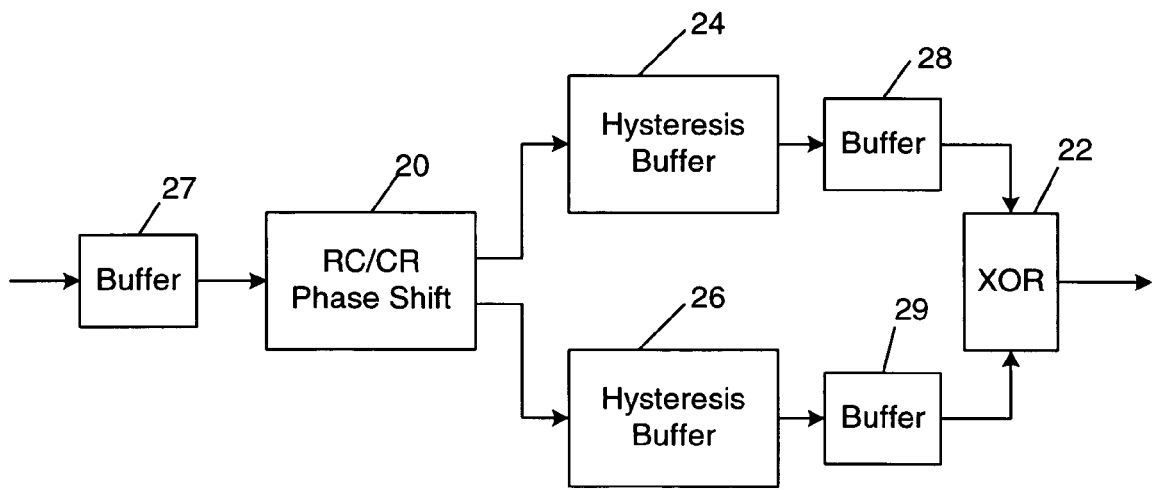
FIG. 2 is a block diagram of a doubler circuit in accordance with the present invention.

In accordance with the present invention, and as shown generally in FIG. 2, a frequency doubler includes not only the conventional components of a phase-shifting circuit 20 and an XOR gate 22, but further includes a pair of hysteresis buffers, indicated by the blocks 24 and 26, which are connected between the respective outputs from the phase-shifting circuit and the respective inputs to the XOR gate. In addition, the doubler includes an input buffer 27 preceding the phase-shifting circuit 20 and additional buffers 28 and 29 connected between the hysteresis buffers 24 and 26, respectively, and the XOR gate 22. As further described below, the hysteresis buffers 24 and 26 modify the outputs from the phase-shifting circuit 20 to produce more nearly square waves that have zero crossings 90° apart.

Figure 3:
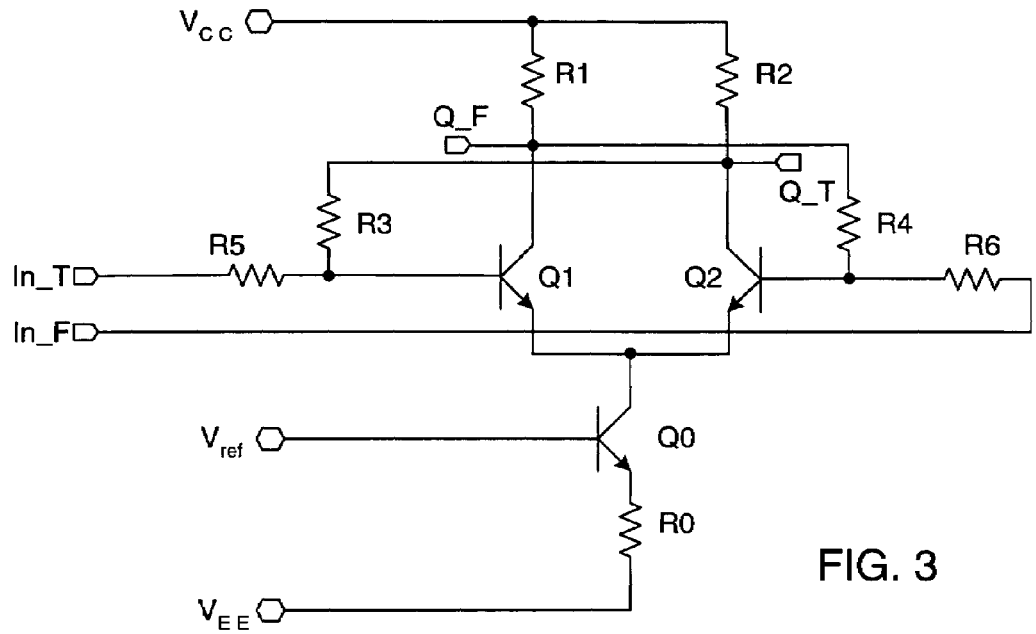
FIG. 3 is a schematic diagram of a hysteresis buffer used in the doubler circuit of the present invention.

Each hysteresis buffer 24 and 26 is a circuit of the type shown by way of example in FIG. 3. The hysteresis buffer of FIG. 3 applies a hysteresis comparator principle to an input signal. The buffer is basically a differential comparator that latches in one or the other of its two states depending on a comparison between the input signal and a selected latching level. Thus, even when the input signal is changing relatively slowly, as in the case of a low-frequency signal, the hysteresis buffer latches rapidly in one or the other of its two states, producing a more square-shaped output signal.

The hysteresis buffer of FIG. 3 is depicted as including a current source comprising transistor Q0 and resistor R0 coupled to a power supply, indicated by reference voltage source Vref and voltage levels Vcc and Vee, and a pair of parallel transistors Q1 and Q2 with load resistors R1 and R2, respectively, which provide parallel current paths through the current source. An input signal, on lines indicated as In_T and In_F, is applied to the base terminals of Q1 and Q2, respectively, through series input resistors R5 and R6, respectively. The base of transistor Q1 is coupled to the collector of transistor Q2 through a feedback resistor R3, and the base of transistor Q2 is coupled to the collector of transistor Q1 through a feedback resistor R4. Output signals from the hysteresis buffer are obtained from the collectors of transistors Q2 and Q1, as indicated by terminals Q_T and Q_F, respectively.

In operation of the FIG. 3 circuit, a rising input signal on line In_T (relative to In_F) tends to render transistor Q1 conductive, which in turn tends to lower the voltage at Q_F due to a voltage drop through load resistor R1. The feedback of this Q_F signal to the base of transistor Q2, through feedback resistor R4, tends to turn off transistor Q2, raising the voltage level at output Q_T. Feedback of this Q2 state back to the base of transistor Q1, through feedback resistor R3, turns on transistor Q1 even harder. This feedback mechanism results in a very rapid turn-on and saturation of transistor Q1 as the input signal In_T rises through a selected latching threshold. The process works in reverse when input signal In_F rises through a selected threshold, resulting in rapid turn-on of transistor Q2. The load resistors R1 and R2 are selected to provide desired maximum and minimum output signal levels, and the feedback resistors R3 and R4 and the input load resistors R5 and R6 are selected to provide a desired hysteresis effect.

Figure 4:
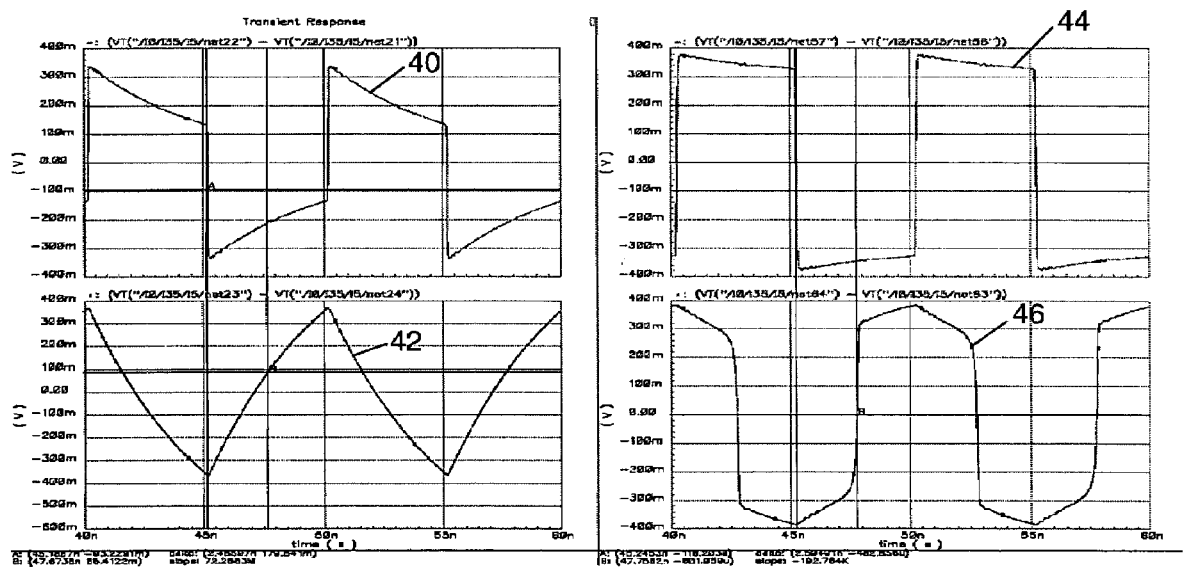
FIG. 4 is a set of four graphs depicting the performance of hysteresis buffers in the doubler circuit of the invention, where the graphs on the left of the figure show the inputs to the respective hysteresis buffers, and the graphs on the right of the figure show the outputs from the respective hysteresis buffers.

FIG. 4 shows the effect of the hysteresis buffers 24 and 26 on typical outputs from the RC-CR phase shift circuit 20. The left-hand graphs in FIG. 4 are the high-pass output, indicated at 40, and the low-pass output, indicated at 42, from the phase shift circuit 20. The high-pass output 40 is a distorted square wave. The signal 40 lacks symmetry and although it has steep signal excursions between positive and negative values, zero crossings do not always occur at the midpoints of these excursions. The low-pass output signal 42 is basically triangular in shape, with no steep excursions. Moreover, zero crossings for the signal 42 occur at times significantly less than 2.5 ns from the zero crossing of the signal 40. (For the example shown, the input signal has a frequency of 100 MHz and a 90° phase difference corresponds to a time difference of 2.5 ns.)

The curves on the right-hand side of FIG. 4 depict the outputs of the hysteresis buffers 24 and 26 when the signals 40 and 42 are applied to the buffer inputs. A latching voltage of approximately 100 mV is selected, resulting in the output signals indicated at 44 and 46, respectively, for the high-pass and low-pass outputs. It will be seen that the output 44 more nearly resembles a square wave, with zero crossings at points approximately half-way along each vertical transition, and with upper and lower signal extremes that are very nearly horizontal. An even more spectacular transformation is seen in output signal 46, which exhibits practically vertical transitions between its extreme values, and with these vertical transitions being spaced almost exactly 90° in phase with respect to the vertical transitions in output signal 44. The extreme values of the signal 46 still exhibit a slight peak in each direction but the overall shape of the signal is predominantly that of a square wave. When the output signals 44 and 46 are input to the XOR gate 22, a double-frequency output is obtained.

The additional buffers 27, 28 and 29 (shown in FIG. 2) at the input of the phase shift circuit 20 and at the inputs to the XOR gate 22, may be used to provide additional gain or signal shaping but are not necessary to the present invention in its simplest form.

It will be appreciated from the foregoing that the present invention represents a significant advance in the field of frequency doubling circuits. In particular, the invention provides a frequency doubler that functions equally well no matter whether the input signal is of high or low frequency or whether it is a square wave or a sine wave. It will also be appreciated that although a specific embodiment of the invention has been described in detail for purposes of illustration, various modifications may be made without departing from the spirit and scope of the invention. Accordingly, the invention should not be limited except as by the appended claims.

The invention claimed is:

1. A frequency doubling circuit, comprising:
   a phase shifting circuit for generating from an input signal a pair of output signals having waveforms that are separated in phase by approximately 90°;
   a pair of hysteresis buffers, operative to enhance the waveforms of the pair of output signals, such that the waveforms have desirably steep transitions and are separated more precisely by a 90° phase difference, each of the hysteresis buffers comprising:
- a differential pair of transistors to which one of the pair of output signals is applied as an input, the transistors having two possible switching states in which one or the other of the transistors is latched in a conductive condition; and
- first and second feedback circuits cross-coupling the outputs of the transistors to their inputs, wherein a gradual change in input signal level results in rapid latching of the pair of transistors in one of its two switching states; and an exclusive OR (XOR) gate, for logically combining the enhanced pair of output signals to produce a single output signal of double the frequency of the input signal.

2. A frequency doubling circuit as defined in claim 1, wherein the phase shifting circuit is a resistance-capacitance/capacitance-resistance (RC/CR) filter.

3. A frequency doubling circuit as defined in claim 1, wherein each of the feedback circuits includes a feedback impedance that is selectable to control a latching voltage.

4. A frequency doubling circuit as defined in claim 3, wherein the latching voltage is selected to provide for buffer latching when the pair of output signals are as nearly as possible separated in phase by 90°.

5. A method for doubling the frequency of an input signal, comprising:
- generating from the input signal a pair of output signals that are separated in phase by approximately 90°;
- applying as an input each of the pair of output signals to a differential pair of transistors, the transistors having two possible switching states in which one or the other of the transistors is latched in a conductive condition;
- cross-coupling the outputs of the transistors to their inputs, through first and second feedback circuits, wherein a gradual change in input signal level results in rapid latching of the pair of transistors in one of its two switching states, such that the waveforms have desirably steep transitions and are separated more precisely by a 90° phase difference; and
- logically combining the enhanced pair of output signals in an exclusive OR (XOR) gate, to produce a single output signal of double the frequency of the input signal.

6. A method as defined in claim 5, wherein the step of generating a pair of output signals is performed in a phase shifting circuit that is a resistance-capacitance/capacitance-resistance (RC/CR) filter.

7. A method as defined in claim 5, further comprising selecting feedback impedance values in the feedback circuits, to control selection of a latching voltage.

8. A method as defined in claim 7, wherein the latching voltage is selected to provide for buffer latching when the pair of output signals are as nearly as possible separated in phase by 90.

* * * * *